US012712156B2

(12) United States Patent
Ko et al.

(10) Patent No.: US 12,712,156 B2
(45) Date of Patent: Aug. 18, 2026

(54) SUBSTRATE PROCESSING APPARATUS

(71) Applicant: Samsung Electronics Co., Ltd., Suwon-si (KR)

(72) Inventors: Jungmin Ko, Suwon-si (KR); Sangki Nam, Suwon-si (KR); Dougyong Sung, Suwon-si (KR); Byeongsang Kim, Suwon-si (KR); Yunhwan Kim, Suwon-si (KR); Suyoung Yoo, Suwon-si (KR); Namkyun Kim, Suwon-si (KR); Kuihyun Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 600 days.

(21) Appl. No.: 18/068,778

(22) Filed: Dec. 20, 2022

(65) Prior Publication Data

US 2023/0317418 A1 Oct. 5, 2023

(30) Foreign Application Priority Data

Apr. 5, 2022 (KR) ........................ 10-2022-0042272

(51) Int. Cl.
*H01J 37/32* (2006.01)

(52) U.S. Cl.
CPC .... *H01J 37/3244* (2013.01); *H01J 37/32568* (2013.01); *H01J 2237/2001* (2013.01); *H01J 2237/3343* (2013.01)

(58) Field of Classification Search
CPC ............. H01J 37/3244; H01J 37/32568; H01J 2237/2001; H01J 2237/3343;
(Continued)

(56) References Cited

U.S. PATENT DOCUMENTS 5,720,818 A * 2/1998 Donde ................ C23C 16/4586 118/728
6,500,299 B1 * 12/2002 Mett ..................... C23C 16/455 118/728
(Continued)

FOREIGN PATENT DOCUMENTS

JP 2020-150255 A 9/2020
KR 10-2004-0003284 A 1/2004
(Continued)

OTHER PUBLICATIONS

Office Action in Korean Appln. No. KR 10-2022-0042272, mailed on Aug. 11, 2025, 12 pages (with English translation).
(Continued)

*Primary Examiner* — Rudy Zervigon
(74) *Attorney, Agent, or Firm* — Fish & Richardson P.C.

(57) ABSTRACT

A substrate processing apparatus includes a process chamber having an internal space; upper and lower electrode portions facing each other in the internal space; and a gas supply unit configured to supply cooling gas to a bottom surface of a substrate seated on the lower electrode portion. The gas supply unit may include a gas supply source outside the process chamber and configured to provide a cooling gas, and a gas filter connected to the gas supply source and including one or more wall surfaces at least partially defining a gas flow path for the cooling gas. The gas filter may include a first and second regions formed of respective materials having different dielectric constants. The first and second regions may be configured so that the cooling gas flowing along the gas flow path flows upwardly concurrently with colliding with a wall surface of the gas flow path.

20 Claims, 17 Drawing Sheets

(58) Field of Classification Search
CPC ........... H01J 37/32532; H01J 37/32715; H01J 37/32724; B01D 46/0005; B01D 46/10; B01D 46/2411; B01D 46/2403; B01D 2275/10; B01D 39/2068; B01J 35/56
USPC ........... 118/728; 156/345.51, 345.52, 345.53
See application file for complete search history.

(56) References Cited

U.S. PATENT DOCUMENTS

| | | | | |
|---|---|---|---|---|
| 8,108,981 | B2 | 2/2012 | Lubomirsky et al. | |
| 12,027,349 | B2 * | 7/2024 | Oka | H01J 37/32715 |
| 12,341,048 | B2 * | 6/2025 | Sulyman | H01J 37/3244 |
| 2005/0011456 | A1 | 1/2005 | Himori et al. | |
| 2005/0105243 | A1 * | 5/2005 | Lee | H01L 21/6833 361/234 |
| 2009/0086400 | A1 * | 4/2009 | Samir | H01L 21/6833 361/234 |
| 2009/0086401 | A1 * | 4/2009 | Samir | H01L 21/6831 361/234 |
| 2017/0352568 | A1 * | 12/2017 | Cho | H01L 21/6831 |
| 2018/0240688 | A1 | 8/2018 | Hao et al. | |
| 2018/0358253 | A1 * | 12/2018 | Noh | H01J 37/32724 |
| 2019/0287838 | A1 * | 9/2019 | Yamaguchi | H01L 21/6833 |
| 2019/0287840 | A1 * | 9/2019 | Katayama | H01L 21/67109 |
| 2019/0371578 | A1 * | 12/2019 | Larosa | H01L 21/67109 |
| 2020/0135529 | A1 * | 4/2020 | Shiraishi | H01L 21/67109 |
| 2020/0286767 | A1 * | 9/2020 | Shiraishi | H01L 21/6831 |
| 2020/0286768 | A1 * | 9/2020 | Shiraishi | H01L 21/6833 |
| 2020/0286769 | A1 * | 9/2020 | Shiraishi | H01L 21/68714 |
| 2020/0373184 | A1 * | 11/2020 | Prouty | H01L 21/67109 |
| 2020/0411283 | A1 | 12/2020 | Bonecutter et al. | |
| 2021/0166958 | A1 | 6/2021 | Oshima | |
| 2021/0225619 | A1 * | 7/2021 | Suzuki | H01L 21/683 |
| 2022/0223387 | A1 * | 7/2022 | Matyushkin | H01L 21/6833 |
| 2022/0258431 | A1 * | 8/2022 | Parkhe | B29C 66/727 |
| 2023/0061208 | A1 * | 3/2023 | Sasaki | H01L 21/6833 |
| 2023/0068968 | A1 * | 3/2023 | Sasaki | H01J 37/32715 |
| 2023/0207370 | A1 * | 6/2023 | Inoue | H01L 21/683 257/703 |
| 2023/0223291 | A1 * | 7/2023 | Inoue | H01L 21/6875 279/128 |
| 2023/0238224 | A1 * | 7/2023 | Inoue | H01L 21/6831 279/128 |
| 2023/0317418 | A1 * | 10/2023 | Ko | H01J 37/32568 156/345.43 |

FOREIGN PATENT DOCUMENTS

| | | | |
|---|---|---|---|
| KR | 10-2004-0066142 | A | 7/2004 |
| KR | 10-0734780 | B1 | 7/2007 |
| KR | 10-2008-0004115 | A | 1/2008 |
| KR | 10-2009-0004114 | A | 1/2009 |
| KR | 10-2011-0056712 | A | 5/2011 |
| KR | 10-2019-0112167 | A | 10/2019 |
| KR | 10-2190030 | B1 | 12/2020 |
| KR | 10-2021-0066721 | A | 6/2021 |
| KR | 10-2021-0072114 | A | 6/2021 |
| KR | 10-2327646 | B1 | 11/2021 |
| WO | WO 2003046969 | A1 | 6/2003 |
| WO | WO-2020/092412 | A1 | 5/2020 |

OTHER PUBLICATIONS

Notice of Allowance in Korean Appln. No. 10-2022-0042272, mailed on Jun. 25, 2026, 7 pages (with English translation).

* cited by examiner

SUBSTRATE PROCESSING APPARATUS

CROSS-REFERENCE TO RELATED APPLICATION

This application claims benefit of priority to Korean Patent Application No. 10-2022-0042272 filed on Apr. 5, 2022 in the Korean Intellectual Property Office, the disclosure of which is incorporated herein by reference in its entirety.

BACKGROUND

1. Field

The present inventive concepts relate to a substrate processing apparatus.

2. Description of Related Art

In general, in a plasma processing apparatus, a substrate needs to be maintained at a constant temperature for reproducibility of a process, and for this reason, a supply pipe for cooling gas, or the like, is installed in a lower electrode. That is, in a conventional plasma processing apparatus, a substrate is adsorbed on the lower dry electrode by an electrostatic chuck, and the cooling gas (for example, helium gas) is sprayed from the gas filter toward a bottom surface of the substrate to uniformize temperature distribution of the substrate.

In the plasma processing apparatus, when plasma is generated on the substrate, a voltage equal to a voltage generated between the lower electrode and the plasma is generated between the lower electrode and a member by high frequency power. In this case, electrons in the cooling gas are accelerated in the gas filter to generate discharge.

However, when such a discharge is generated, since a particular (or, alternatively, in some example embodiments) electric power energy cannot be secured, there may be a problem in that an etching rate is lowered, and etching processing of the substrate is insufficiently performed.

Furthermore, the discharge is generated, an equipment is stopped and carbonized parts must be replaced, so that the process cannot be performed, so that there is a problem in that a manufacturing yield may be lowered.

SUMMARY

Some example embodiments of the present inventive concepts provide a substrate processing apparatus capable of preventing discharge of a gas flowing through a gas supply path.

According to some example embodiments of the present inventive concepts, a substrate processing apparatus includes a process chamber having one or more inner surfaces at least partially defining an internal space; an upper electrode portion in an upper end portion of the internal space of the process chamber; a lower electrode portion in the internal space of the process chamber to face the upper electrode portion; and a gas supply unit configured to supply cooling gas to a bottom surface of a substrate that is seated on the lower electrode portion, wherein the gas supply unit includes a gas supply source outside the process chamber and configured to provide cooling gas, and a gas filter connected to the gas supply source and configured to guide the cooling gas that is provided by the gas supply source into the process chamber, wherein the gas filter includes one or more wall surfaces at least partially defining a gas flow path for the cooling gas, wherein the gas filter includes a first region including a first material and a second region including a second material having a dielectric constant, the first and second materials having different respective dielectric constants, wherein the first region and the second region are configured to cause the cooling gas flowing through the gas flow path to flow upwardly concurrently with colliding with the one or more wall surfaces at least partially defining the gas flow path.

According to some example embodiments of the present inventive concepts, a substrate processing apparatus, may include a process chamber having one or more inner surfaces at least partially defining an internal space; an upper electrode portion in an upper end portion of the internal space of the process chamber; a lower electrode portion in the internal space of the process chamber to face the upper electrode portion; and a gas supply unit configured to supply cooling gas to a bottom surface of a substrate seated on the lower electrode portion, wherein the gas supply unit includes a gas supply source outside the process chamber and configured to provide a cooling gas; and a gas filter connected to the gas supply source and configured to guide the cooling gas provided by the gas supply source into the process chamber, wherein the gas filter includes one or more wall surfaces at least partially defining a gas flow path for the cooling gas, and wherein the gas filter includes an insertion layer that is configured to be inclined with respect to the gas flow path.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Figure 1:
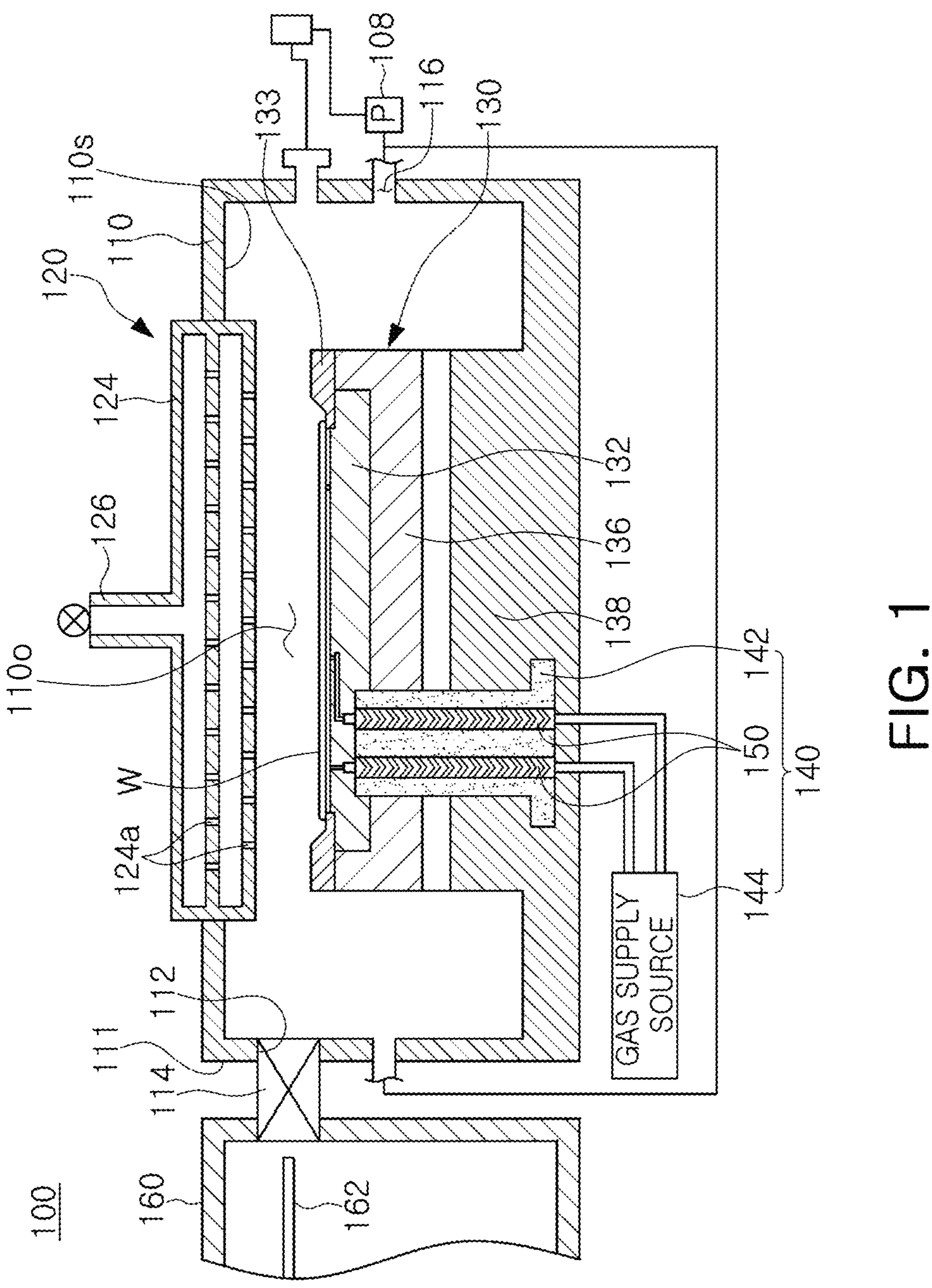
FIG. 1 is a schematic configuration diagram illustrating a substrate processing apparatus according to some example embodiments.

Hereinafter, example embodiments of the present inventive concepts will be described with reference to the accompanying drawings.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

FIG. 1 is a schematic configuration diagram illustrating a substrate processing apparatus according to some example embodiments.

Referring to FIG. 1, a substrate processing apparatus 100 includes, for example, a vacuum chamber 110, an upper electrode portion 120, a lower electrode portion 130, and a gas supply unit 140.

The vacuum chamber 110 may be referred to interchangeably herein as a "process chamber." The vacuum chamber 110 provides an internal space in which a processing process (e.g., an etching process) on the loaded substrate W may be performed. For example, as shown, the vacuum chamber 110 may include one or more inner surfaces 110*s* that at least partially define an internal space 110*o* within the vacuum chamber 110 and in which a processing process (e.g., an etching process) on the loaded substrate W may be performed. Meanwhile, a gate valve 114 for opening and closing an entrance 112 of the substrate W may be installed outside an outer wall 111 of the vacuum chamber 110. A load lock chamber 160 in which a wafer transfer arm 162 is disposed may be connected to the gate valve 114.

Here, looking at an operation of loading the substrate W into the vacuum chamber 110, a pressure of the load lock chamber 160 is reduced to a level similar to that of the vacuum chamber 110, and then the wafer W is loaded into the vacuum chamber 110 from the load lock chamber 160 using the wafer transfer arm 162. Thereafter, the wafer transfer arm 162 is discharged from the vacuum chamber 110 to the load lock chamber 160, and then the gate valve 114 is closed.

Meanwhile, the vacuum chamber 110 is connected to a particular (or, alternatively, in some example embodiments) pressure reducing device 108 through an exhaust pipe 116 disposed in a particular (or, alternatively, in some example embodiments) region. Accordingly, the vacuum chamber 110 may provide low internal pressure required for excellent etching properties.

An upper electrode portion 120, serving as a processing gas supply unit, is disposed in an upper end portion of the internal space 110*o* of the vacuum chamber 110 (e.g., is positioned at an upper end portion of the vacuum chamber 110). In some example embodiments, one or more lower surfaces of the upper electrode portion 120 may at least partially define the upper end portion of the internal space 110*o* of the vacuum chamber 110. The upper electrode portion 120 includes a shower head 124 having a plurality of spraying holes 124*a* and an inlet 126. The shower head 124 is configured to uniformly supply the processing gas supplied from the processing gas filter (not shown) via the inlet 126 to a space (e.g., a portion of the internal space 110*o*) above the substrate W in the vacuum chamber 110.

A lower electrode portion 130 is disposed in a lower portion of the vacuum chamber 110, below the internal space 110*o* of the vacuum chamber 110 (e.g., is positioned at a lower end portion of the vacuum chamber 110) to face the upper electrode portion 120. An electrostatic chuck 132 for fixing the substrate W may be disposed at an uppermost end of the lower electrode portion 130. The electrostatic chuck 132 may be formed of a circular plate formed of an insulating material such as a ceramic. The electrostatic chuck 132 includes two polyimide-based films and a conductive thin film disposed therebetween. The conductive thin film is connected to a high-pressure DC power supply (not shown) disposed outside the vacuum chamber 110. When a particular (or, alternatively, in some example embodiments) voltage is applied to the conductive thin film from a high-voltage current power source, charges are generated on a surface of the polyimide-based film to generate coulomb force to fix the substrate W to an upper surface of the electrostatic chuck 132. A focus ring 133 on which the substrate W is seated may be provided above the electrostatic chuck 132. As an example, the focus ring 133 may have a circular ring shape. The focus ring 133 may be formed of a conductive material such as metal. Meanwhile, the focus ring 133 serves to improve uniformity of plasma sheath formed on the substrate W by moving active ions or radicals of source plasma to a peripheral portion of the wafer. Accordingly, the source plasma formed in the internal space of the vacuum chamber 110 may be intensively formed in an upper region of the substrate. Meanwhile, the focus ring 133 may be formed of any one of silicon (Si), silicon carbide (SiC), silicon oxide ($SiO_2$), and aluminum oxide ($Al_2O_3$). In addition, an insulating member 136 may be disposed in a lower end portion of the lower electrode portion 130, and a conductive member 138 forming an outer wall of the vacuum chamber 110 may be disposed below the insulating member 136. Meanwhile, the conductive member 138 may serve as a ground electrode, and may be disposed to have a lower potential than a body 142 to be described later as an example.

The gas supply unit 140 may include a body 142, a gas supply source 144, and a gas filter 150. The body 142 may be installed such that at least a portion thereof is embedded in the insulating member 136. In addition, the gas filter 150 may be installed inside the body 142. To this end, the body 142, which may be a body structure, may be provided with (e.g., may include) an installation hole 142*a* in which the gas filter 150 is installed.

The gas supply source 144 may be disposed outside (e.g., external to) the vacuum chamber 110 and connected to the gas filter 150. In some example embodiments, the gas supply source may include a pressurized container holding (e.g., accommodating) a gas and including, for example, a control valve configured to be actuated to selectively supply the gas from the pressurized container through an outlet of the pressurized container. As an example, gas accommodated in the gas supply source 144 and supplied through the gas filter 150 may be cooling gas (such as helium).

The gas filter 150 is installed on the body 142 and may serve to (e.g., may be configured to) supply gas to a bottom surface of the substrate W. A detailed description of the gas filter 150 will be described later.

Meanwhile, in some example embodiments, a case in which the body 142 is provided in the gas supply unit 140 is described as an example, but the present inventive concepts are not limited thereto and the body 142 may be omitted. In other words, the gas filter 150 of the gas supply unit 140 may be connected to the gas supply source 144, and only the gas filter 150 may be installed in the vacuum chamber 110. The gas filter 150 may be configured to guide the gas (e.g., cooling gas) that is provided by the gas supply source 144 into the vacuum chamber 110.

Figure 2:
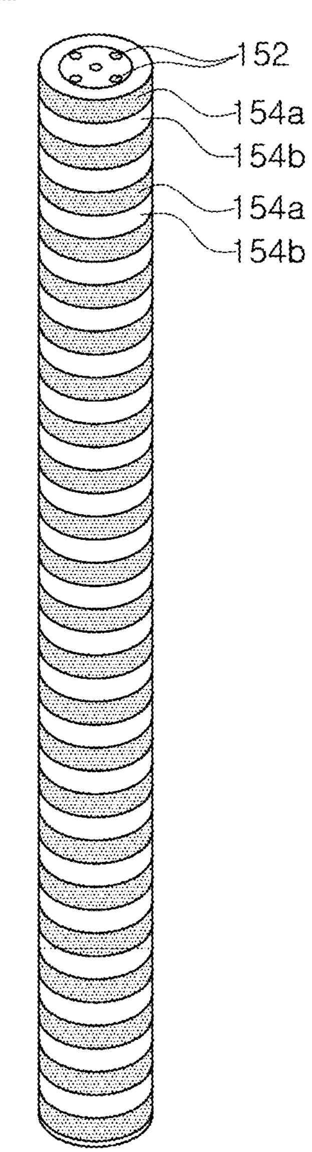
FIG. 2 is a perspective view illustrating a gas filter according to some example embodiments of the present inventive concepts.
Figure 3:
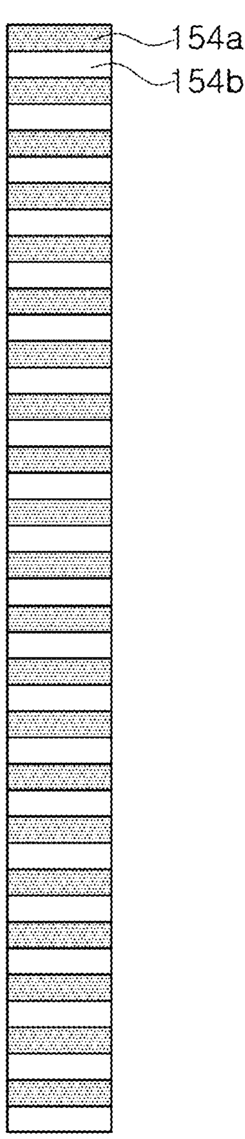
FIG. 3 is a front view illustrating a gas filter according to some example embodiments of the present inventive concepts.
Figure 4:
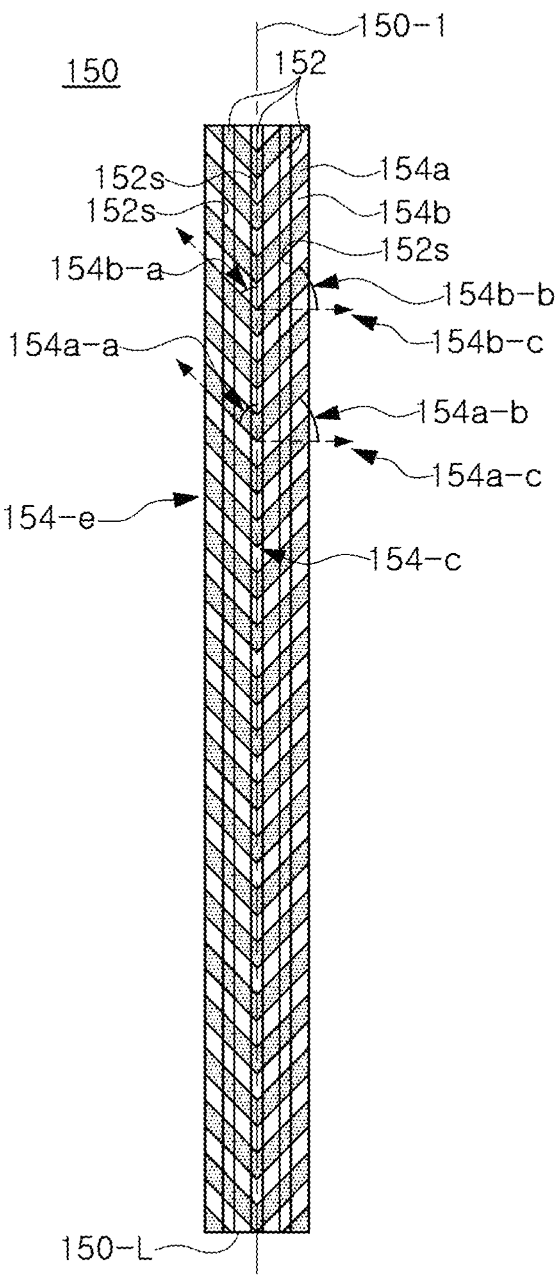
FIG. 4 is a cross-sectional view illustrating a gas filter according to some example embodiments of the present inventive concepts.

FIG. 2 is a perspective view illustrating a gas filter according to some example embodiments of the present inventive concepts, FIG. 3 is a front view illustrating a gas filter according to some example embodiments of the present inventive concepts, and FIG. 4 is a cross-sectional view illustrating a gas filter according to some example embodiments of the present inventive concepts.

Referring to FIGS. 2 to 4, the gas filter 150 may include a gas flow path 152 through which gas flows, which may also be referred to as a gas flow path 152 for the cooling gas as described herein. For example, as shown in at least FIG. 4, the gas filter 150 may include one or more inner wall surfaces **152*s* at least partially defining the gas flow path 152 for a gas (e.g., the cooling gas as described herein), where the gas flow path is configured to direct gas (e.g., the cooling gas) to flow therethrough (e.g., the gas filter 150 may be configured to direct gas, such as the cooling gas as described herein, to flow through the gas flow path 152 at least partially defined by the one or more inner wall surfaces 152*s*). A plurality of gas flow paths 152 may be provided, and the gas flow paths 152 may be vertically disposed to have a straight shape in up and down directions (e.g., a linear shape extending in a vertical direction, for example a direction extending in parallel to a central longitudinal axis 150-1 of the gas filter 150, as shown in at least FIG. 4 in view of FIG. 1). As an example, the gas filter 150 may be formed of (e.g., may comprise) two materials having different dielectric constants. In addition, in the gas filter 150, two materials having different dielectric constants may be alternately disposed with each other, and the materials having different dielectric constants may be disposed to be inclined with respect to the gas flow path 152. For example, the gas filter 250 may include a first region 154*a* formed of (e.g., including) a first material and a second region 154*b* formed of (e.g., including) a second material having a dielectric constant different from that of the first region 154*a* formed of the first material (e.g., the first and second materials may have different respective dielectric constants). The first region 154*a* and the second region 154*b* may be alternately disposed (e.g., alternately arranged in the gas filter 150). For example, as shown, the gas filter 150 may include a plurality of first regions 154*a* and a plurality of second regions 154*b*, the plurality of first regions 154*a* including the first region 154*a* as described herein, the plurality of second regions 154*b* including the second region 154*b* as described herein. The gas filter 150 may include an alternating stack of first and second regions 154*a* and 154*b* as shown in at least FIGS. 2-4, such that the first and second regions 154*a* and 154*b* are alternately arranged in the gas filter 150. It may be understood that a first region 154*a* as described herein may be one first region 154*a* of a plurality of first regions 154*a* and may be representative of one or more or all of the plurality of first regions 154*a*, such as shown in FIGS. 2-4, and a second region 154*b* as described herein may be one second region 154*b* of a plurality of second regions 154*b*, and may be representative of one or more or all of the plurality of second regions 154*b*. In some example embodiments, the first region 154*a* and the second region 154*b* may have a bent line shape in which a center of the gas filter 150 is disposed therebelow and an edge thereof is disposed thereabove. For example, as shown in at least FIG. 4, each of the first region 154*a* and the second region 154*b* may have an inverted conical shape, having a central axis coaxial with the longitudinal central axis 150-1 of the gas filter 150, such that a "lowest" vertical level of each region of the first and second regions 154*a* and 154*b* is the center 154-*c* of the respective region at the centerline (e.g., central longitudinal axis 150-1) of the gas filter 150, and an outer edge 154-*e* of each given region of the first and second regions 154*a* and 154*b*** are located at a higher vertical level than the center of the given region.

As described herein, a given region (e.g., a first region **154*a* and/or a second region 154*b*) that is inclined (e.g., with respect to one or more gas flow paths 152) may have an inclined shape wherein the given region is inclined with respect to one or more gas flow paths 152, where the one or more gas flow paths 152 may extend in parallel (e.g., paraxially) with the central longitudinal axis 150-1 (e.g., centerline) of the gas filter 150. A region having an inclined shape and/or being inclined and/or including one or more materials that are inclined as described herein may be inclined and/or may have an upper and/or lower surface that is inclined with respect to the one or more gas flow paths 152 according to an inclination angle that is less than 90 degrees (e.g., is an acute angle). Such an inclination angle may be defined as an angle of the region (e.g., 154*a* and/or 154*b*) and/or a surface thereof in relation to a gas flow path 152 and/or an inner wall surface 152*s* thereof and thus an angle in relation to a direction extending parallel to the central longitudinal axis 150-1 (e.g., inclination angles 154*a-a* and/or 154*b-a*) and/or an angle of the region (e.g., 154*a* and/or 154*b*) and/or a surface thereof in relation to a plane extending perpendicular to the central longitudinal axis 150-1 (e.g., plane 154*a-c* and/or 154*b-c*). The first region 154*a* and the second region 154*b* may have the same thickness and a same inclination angle (e.g., a same inclination angle 154*a-a* and 154*b-a* in relation to a central longitudinal axis 150-1 of the gas filter 150. However, the present inventive concepts are not limited thereto, and the first region 154*a* and the second region 154*b* may have different thicknesses from each other. As described herein, and as shown in at least FIG. 4, an inclination, or inclination angle, of a region may be an inclination angle of a surface of the region in relation to the direction in which one or more gas flow paths 152 extend and/or a direction of the central longitudinal axis 150-1**.

As described herein, a vertical level of a given portion, region, or any element of the gas filter 150 may refer to a distance in the vertical direction in the gas filter 150 (e.g., a distance in the direction extending parallel to the central longitudinal axis 150-1 of the gas filter 150) from the bottom surface 150-L of the gas filter. For example, an element, region, portion, or the like in a gas filter 150 that is described to have a lower vertical level than another element, region, portion, or the like in the gas filter 150 may be understood to be closer to the bottom surface 150-L in the vertical direction that is parallel to the central longitudinal axis 150-1 than the other element, region, portion, or the like.

Figure 5:
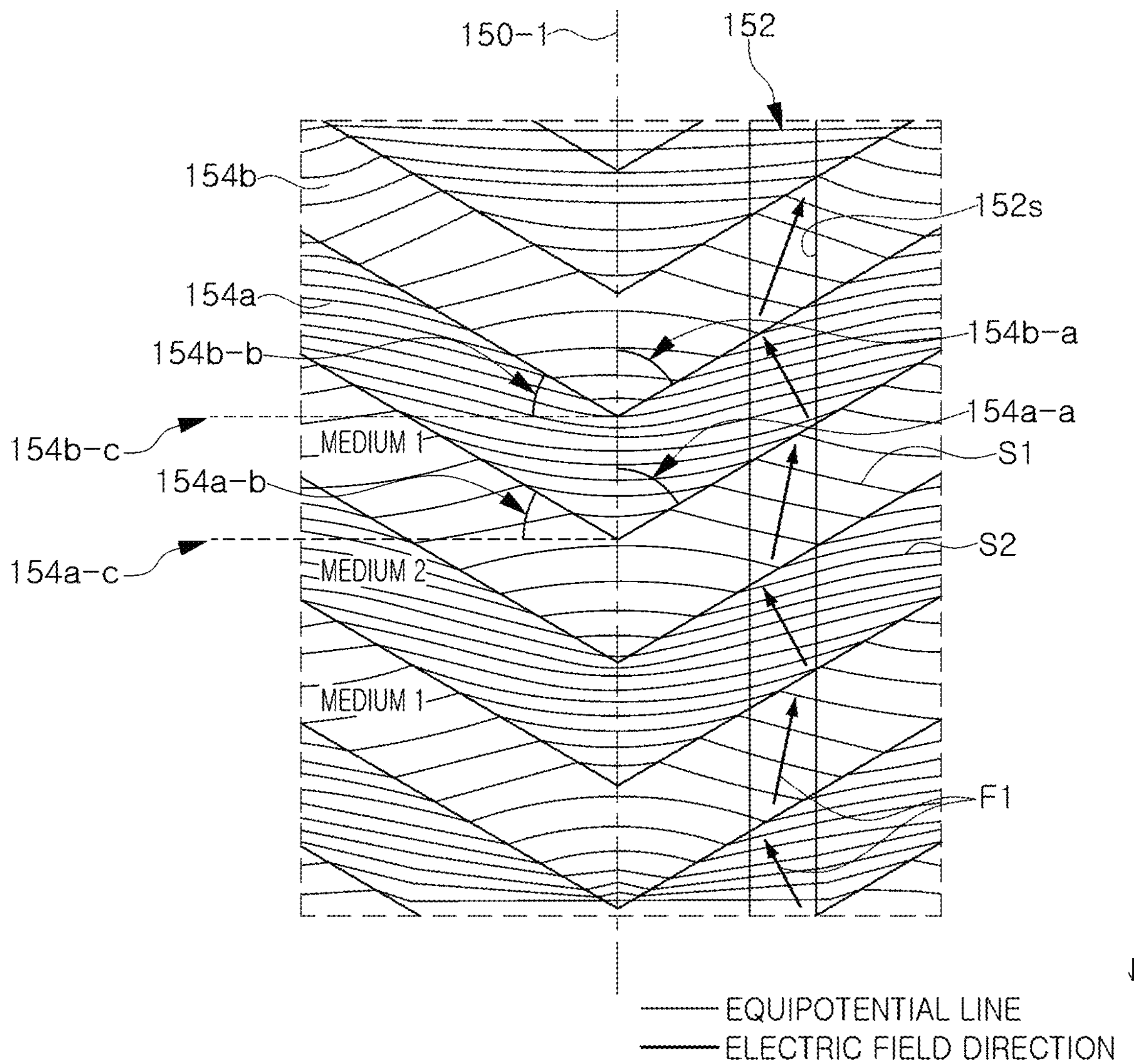
FIG. 5 is a schematic diagram illustrating an equipotential line of a gas filter and a flow direction of gas according to some example embodiments of the present inventive concepts.

Accordingly, as illustrated in FIG. 5, an equipotential line 51 of the first region **154*a* and an equipotential line S2 of the second region 154*b* may be disposed to be inclined with respect to the gas flow path 152 (e.g., may define an angle with an inner wall surface 152***s* of the gas flow path 152, and thus with a direction that is parallel to the central longitudinal axis 150-1, that is not 90 degrees, for example an acute or obtuse angle in relation to a gas flow path 152 and/or inner wall surface 152*s* thereof that extends parallel to the central longitudinal axis 150-1) and the equipotential line 51 of the first region 154*a* and the equipotential line S2 of the second region 154*b* may be disposed to have different inclination angles (e.g., define different angles in relation to the gas flow path 152 and/or one or more inner wall surfaces 152*s* at least partially defining the gas flow path 152 and extending parallel to the central longitudinal axis 150-1). Accordingly, electrons in the gas flowing along the gas flow path 152 collide with the wall surface 152*s* of the gas flow path 152 while (e.g., concurrently with) the gas flows upwards vertically along the gas flow path 152 in a vertical direction extending parallel to the central longitudinal axis 150-1 (and thus at an angle with each of the equipotential lines 51 and S2 that corresponds to the inclination angles of the equipotential lines 51 and S2 with the gas flow path 152) as shown in an electric field direction F1 shown in FIG. 5 and be moved upwardly along the gas flow path 152. In other words, as illustrated in FIG. 5, in the gas filter 150 in which the electric field direction is obliquely disposed, a gas (e.g., electrons thereof) may collide with a wall surface 152*s* of the gas flow path 152 in an oblique electric field direction while (e.g., concurrently with) the gas flows upwards (e.g., parallel to central longitudinal axis 150-1) through the gas flow path 152 to lose energy and suppress (e.g., reduce or prevent) discharge, thereby enabling the gas filter 150 to operate (e.g., guide gas to the process chamber 100) with improved performance and reliability due to suppressed discharge, and thus enabling the substrate processing apparatus 100 to operate with improved performance and/or reliability, and further enabling the substrate processing apparatus 100 to reduce the likelihood of defects in the processing of a substrate W therein, thereby improving the reliability and/or performance of devices created based on the substrate processing apparatus 100 enabling a substrate processing operation (e.g., an etching process) to be performed on the substrate W loaded therein, due to the improved performance and/or reliability of the substrate processing apparatus 100 during the substrate processing operation. Meanwhile, the smaller the diameter of the gas flow path 152 is, the easier it is for electrons to collide with the wall surface 152*s* of the gas flow path 152. Therefore, the smaller the diameter is, the more advantageous it is to suppress discharge.

Meanwhile, in the some example embodiments, a case in which the gas filter 150 includes a first region 154*a* formed of a first material and a second region 154*b* formed of a second material having a dielectric constant different from that of the first material is described as an example, but is not limited thereto. That is, the gas filter 150 may be formed of three or more materials having different dielectric constants. In this case, the three regions may be sequentially and alternately disposed.

Figure 6:
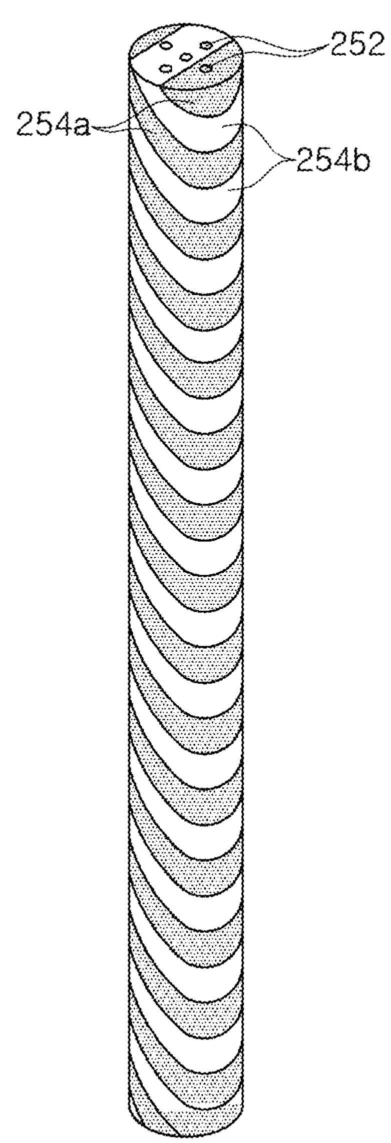
FIG. 6 is a perspective view illustrating a gas filter according to some example embodiments of the present inventive concepts.
Figure 7:
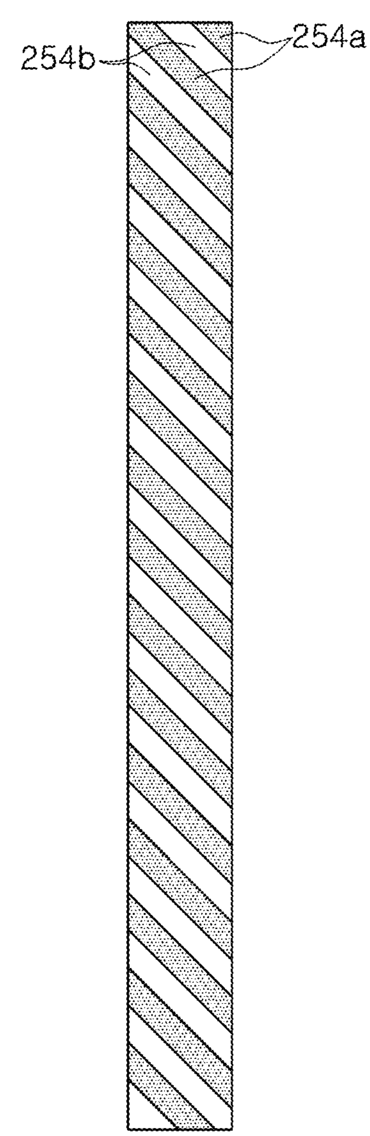
FIG. 7 is a front view illustrating a gas filter according to some example embodiments of the present inventive concepts.
Figure 8:
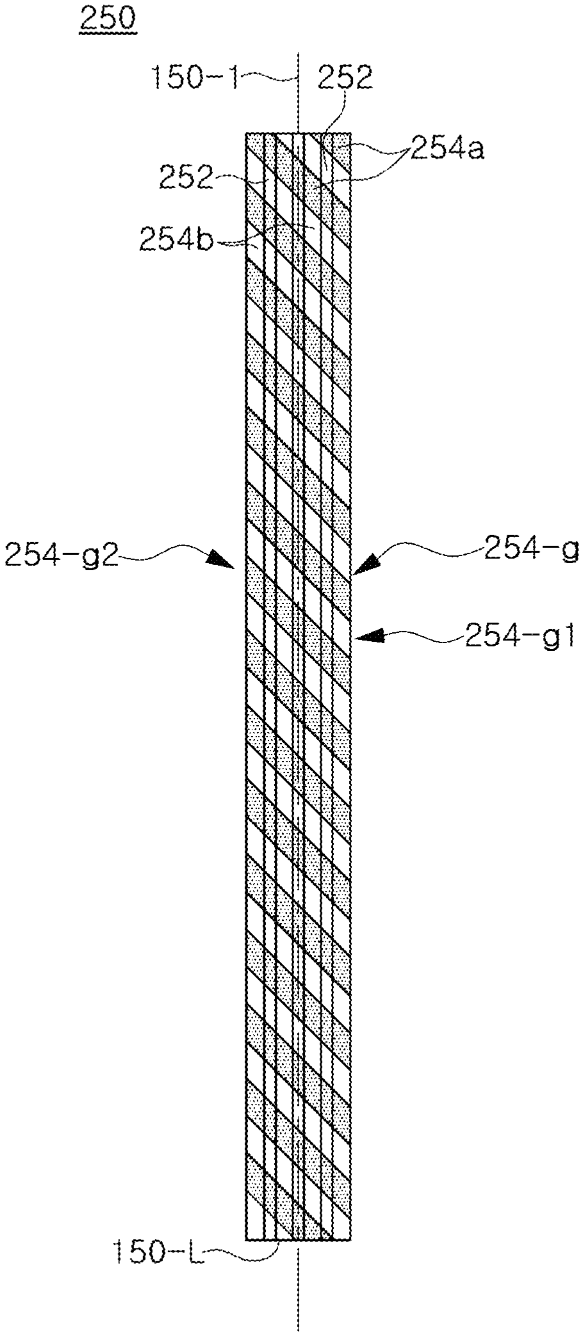
FIG. 8 is a cross-sectional view illustrating a gas filter according to some example embodiments of the present inventive concepts.

FIG. 6 is a perspective view illustrating a gas filter according to some example embodiments of the present inventive concepts, FIG. 7 is a front view illustrating a gas filter according to some example embodiments of the present inventive concepts, and FIG. 8 is a cross-sectional view illustrating a gas filter according to some example embodiments of the present inventive concepts.

Referring to FIGS. 6 to 8, the gas filter 250 may include a gas flow path 252 through which gas flows. A plurality of gas flow paths 252 may be provided, and the gas flow paths 252 may be vertically disposed to have a straight shape in up and down directions. As an example, the gas filter 250 may be formed of two materials having different dielectric constants. In addition, in the gas filter 250, two materials having different dielectric constants may be alternately disposed with each other, and the materials having different dielectric constants may be disposed to be inclined with respect to the gas flow path 252. For example, the gas filter 250 may include a first region 254*a* formed of a first material and a second region 254*b* formed of a second material having a dielectric constant different from that of the first region 254*a* formed of the first material. As shown, at least one given region 254-*g* (e.g., some or all regions) of the first region 254*a* and the second region 254*b* may have one end portion 254-*g*1 at one edge of the of the gas filter 150 that is at a lower vertical level (e.g., closer to bottom surface 150-L in a direction parallel to the central longitudinal axis 150-1) than another (e.g., opposite) end portion 254-*g*2, and may be configured to be inclined with respect to the gas flow path 252 (e.g., inclined in relation to the central longitudinal axis 150-1 and/or a perpendicular thereof). The first region 254*a* and the second region 254*b* may be alternately disposed. Meanwhile, each layer of the first region 254*a* formed of a plurality of layers may have different inclination angles and different thicknesses, and further, each layer of the second region 254*b* formed of a plurality of layers may also have different inclination angles and different thicknesses from each other.

Meanwhile, in the some example embodiments, a case in which the gas filter 250 includes a first region 254*a* formed of a first material and a second region 254*b* formed of a second material having a dielectric constant different from that of the first material is described as an example, but is not limited thereto. That is, the gas filter 250 may be formed of three or more materials having different dielectric constants. In this case, the three regions may be sequentially and alternately disposed.

Figure 9:
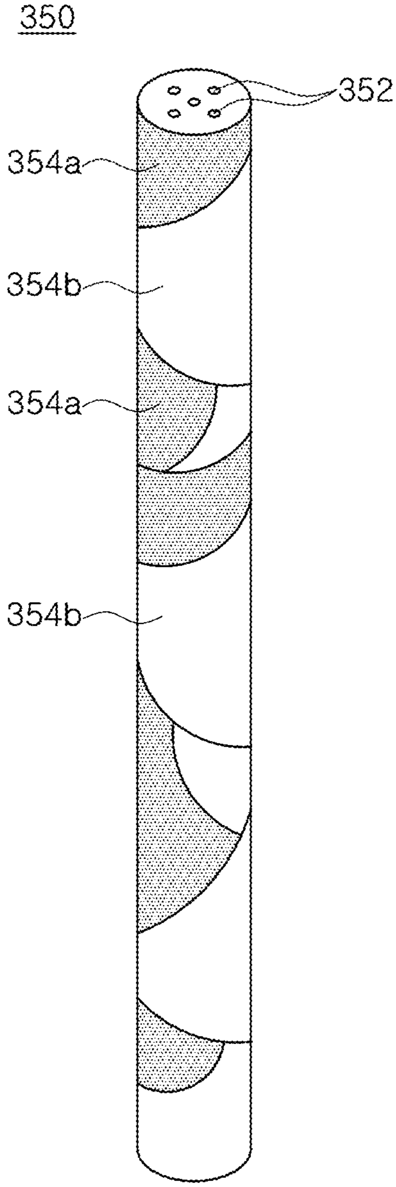
FIG. 9 is a perspective view illustrating a gas filter according to some example embodiments of the present inventive concepts.
Figure 10:
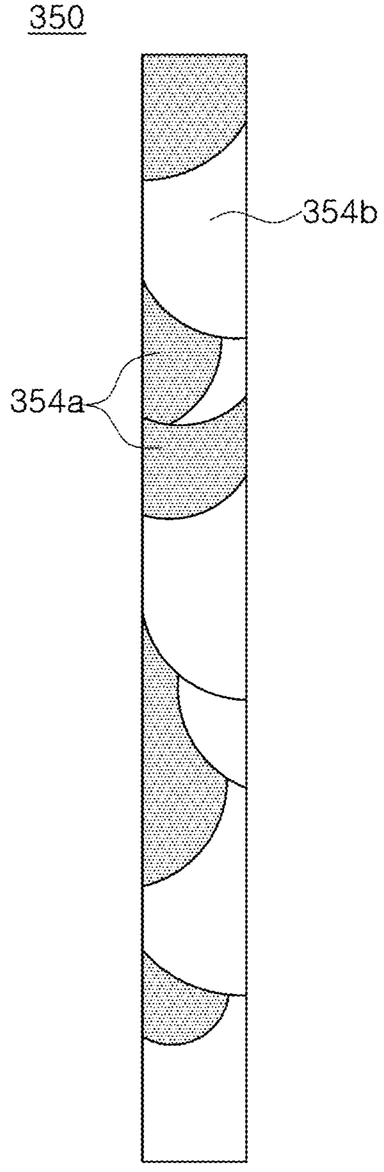
FIG. 10 is a front view illustrating a gas filter according to some example embodiments of the present inventive concepts.
Figure 11:
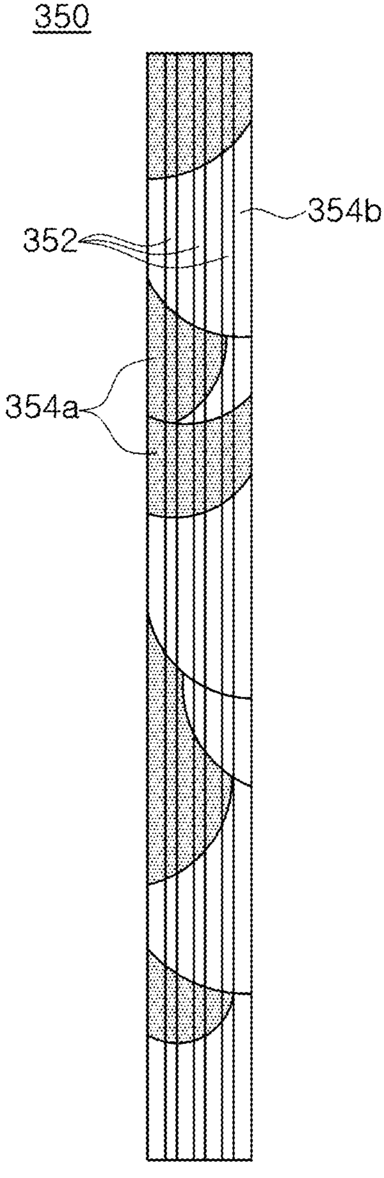
FIG. 11 is a cross-sectional view illustrating a gas filter according to some example embodiments of the present inventive concepts.

FIG. 9 is a perspective view illustrating a gas filter according to some example embodiments of the present inventive concepts, FIG. 10 is a front view illustrating a gas filter according to some example embodiments of the present inventive concepts, and FIG. 11 is a cross-sectional view illustrating a gas filter according to some example embodiments of the present inventive concepts.

Referring to FIGS. 9 to 11, the gas filter 350 may include a gas flow path 352 through which gas flows. A plurality of gas flow paths 352 may be provided, and the gas flow paths 352 may be vertically disposed to have a straight shape in up and down directions. As an example, the gas filter 350 may be formed of two materials having different dielectric constants. In addition, in the gas filter 350, two materials having different dielectric constants may be alternately disposed with each other, and the materials having different dielectric constants may be disposed to be inclined with respect to the gas flow path 352. For example, the gas filter 350 may include a first region 354*a* formed of a first material and a second region 354*b* formed of a second material having a dielectric constant different from that of the first region 354*a* formed of the first material. The first region 354*a* and the second region 354*b* may be alternately disposed. Meanwhile, each layer of the first region 354*a* formed of a plurality of layers may have different inclination angles and different thicknesses, and further, each layer of the second region 354*b* formed of a plurality of may also have different inclination angles and different thicknesses from each other.

Meanwhile, in the some example embodiments, a case in which the gas filter 350 includes a first region 354*a* formed of a first material and a second region 354*b* formed of a second material having a dielectric constant different from that of the first material is described as an example, but is not limited thereto. That is, the gas filter 350 may be formed of three or more materials having different dielectric constants. In this case, the three regions may be sequentially and alternately disposed.

Figure 12:
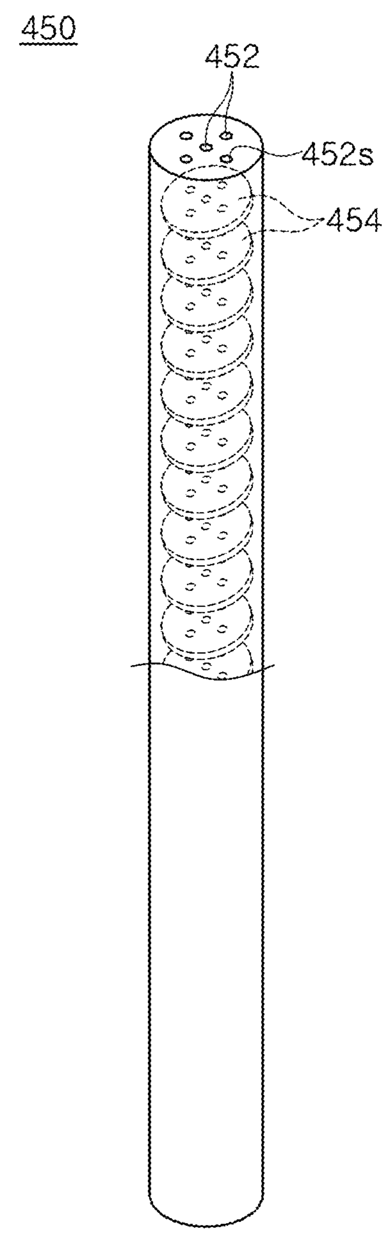
FIG. 12 is a perspective view illustrating a gas filter according to some example embodiments of the present inventive concepts.
Figure 13:
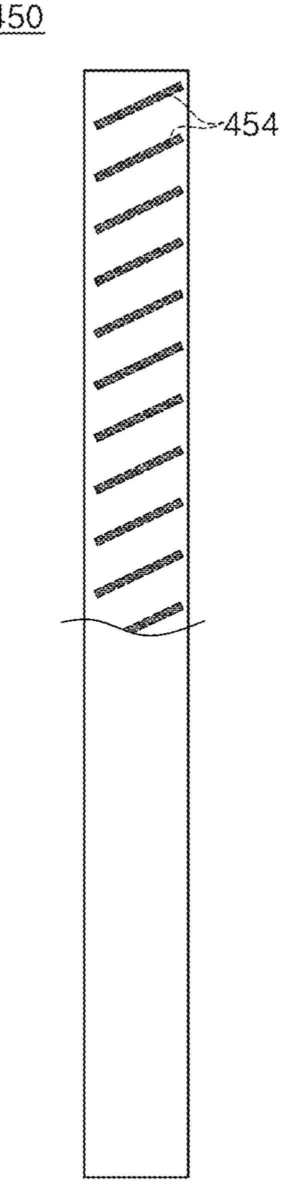
FIG. 13 is a front view illustrating a gas filter according to some example embodiments of the present inventive concepts.
Figure 14:
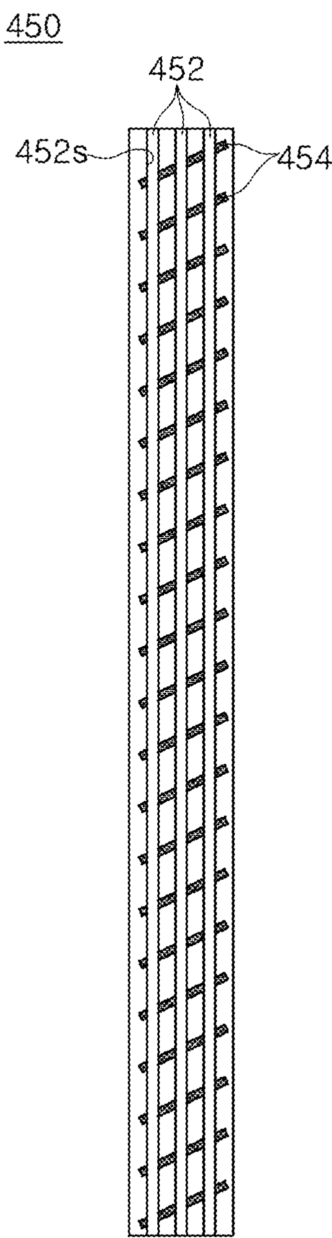
FIG. 14 is a cross-sectional view illustrating a gas filter according to some example embodiments of the present inventive concepts.

FIG. 12 is a perspective view illustrating a gas filter according to some example embodiments of the present inventive concepts, FIG. 13 is a front view illustrating a gas filter according to some example embodiments of the present inventive concepts, and FIG. 14 is a cross-sectional view illustrating a gas filter according to some example embodiments of the present inventive concepts.

Referring to FIGS. 12 to 14, the gas filter 450 may include a gas flow path 452 through which gas flows. A plurality of gas flow paths 452 may be provided, and the gas flow path 452 may be disposed to have a straight shape in up and down directions. As an example, the gas filter 450 may be formed of a first material. As an example, the gas filter 450 may be formed of a dielectric material. Meanwhile, the gas filter 450 may include an insertion layer 454 insertedly disposed inside the gas filter 450 without interfering with the gas flow path 452 and formed of a second material. The insertion layer 454 may be formed of a material different from that of the first material, and the insertion layer 454 may be formed of a conductive material. Meanwhile, a plurality of insertion layers 454 may have the same inclination angle, and a cross-section thereof may have a linear shape. However, the present inventive concepts are not limited thereto, and the plurality of insertion layers 454 may have two or more inclination angles.

Accordingly, since an equipotential surface is formed to be inclined by the insertion layer 454, electrons may collide with a wall surface 452*s* of the gas flow path 452 along an oblique electric field direction, thereby losing energy and suppressing discharge.

Figure 15:
FIG. 15 is a perspective view illustrating a gas filter according to some example embodiments of the present inventive concepts.
Figure 15:
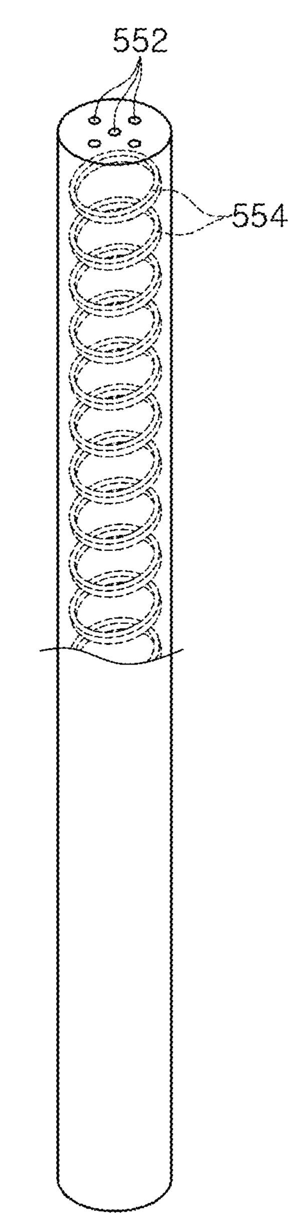
Figure 16:
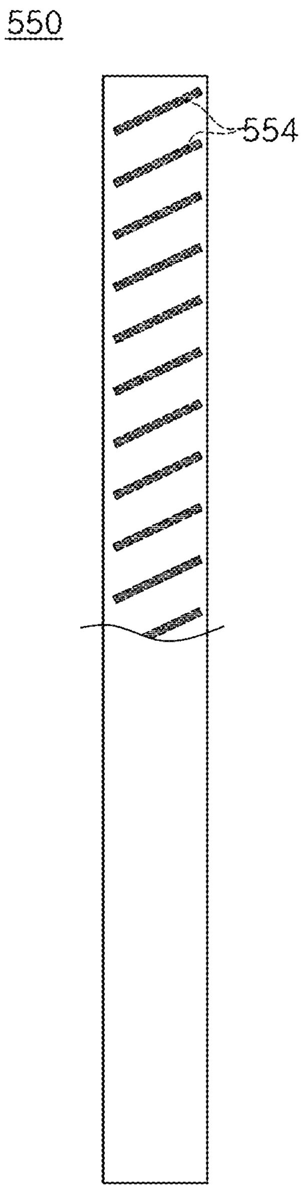
FIG. 16 is a front view illustrating a gas filter according to some example embodiments of the present inventive concepts.
Figure 17:
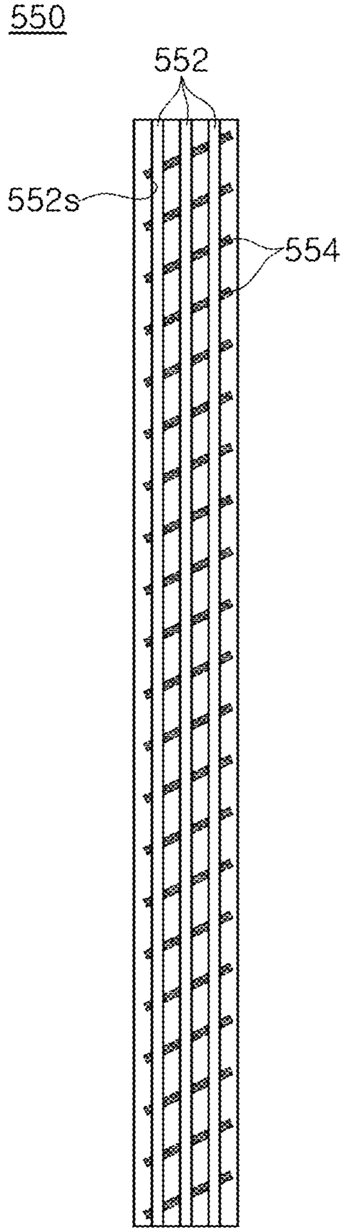
FIG. 17 is a cross-sectional view illustrating a gas filter according to some example embodiments of the present inventive concepts.

FIG. 15 is a perspective view illustrating a gas filter according to some example embodiments of the present inventive concepts, FIG. 16 is a front view illustrating a gas filter according to some example embodiments of the present inventive concepts, and FIG. 17 is a cross-sectional view illustrating a gas filter according to some example embodiments of the present inventive concepts.

Referring to FIGS. 15 to 17, the gas filter 550 may include a gas flow path 552 through which gas flows. A plurality of gas flow paths 552 may be provided, and the gas flow paths 552 may be disposed to have a straight shape in up and down directions. As an example, the gas filter 550 may be formed of a first material. As an example, the gas filter 450 may be formed of a dielectric material. Meanwhile, the gas filter 550 may be provided with an insertion layer 554 insertedly disposed inside the gas filter 550 without interfering with the gas flow path 552 and formed of a second material. The insertion layer 554 may be formed of a material different from that of the first material, and the insertion layer 554 may be formed of a conductive material. Meanwhile, the insertion layer 554 may have a circular annular shape disposed to surround the gas flow path 552. In addition, a plurality of insertion layers 554 may have the same inclination angle. However, the present inventive concepts are not limited thereto, and the plurality of insertion layers 554 may have two or more inclination angles.

Accordingly, since an equipotential surface is formed to be inclined by the insertion layer 554, electrons may collide with a wall surface 552*s* of the gas flow path 552 along an oblique electric field direction, thereby losing energy and suppressing discharge.

As set forth above, according to some example embodiments of the present inventive concepts, a substrate processing apparatus capable of preventing discharge of gas flowing through a gas supply path may be provided.

Herein, a lower side, a lower portion, a lower surface, and the like, are used to refer to a direction toward a mounting surface of the fan-out semiconductor package in relation to cross-sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe some example embodiments rather than limiting the present inventive concepts. In this case, singular forms include plural forms unless interpreted otherwise in context.

The various and advantageous advantages and effects of the present inventive concepts are not limited to the above description, and may be more easily understood in the course of describing the specific embodiments of the present inventive concepts.

While some example embodiments have been shown and described above, it will be apparent to those skilled in the art that modifications and variations could be made without departing from the scope of the present inventive concepts as defined by the appended claims.

What is claimed is:

1. A substrate processing apparatus, comprising:

a process chamber having one or more inner surfaces at least partially defining an internal space;

an upper electrode portion in an upper end portion of the internal space of the process chamber;

a lower electrode portion in the internal space of the process chamber to face the upper electrode portion; and a gas supply unit configured to supply cooling gas to a bottom surface of a substrate that is seated on the lower electrode portion, wherein the gas supply unit includes, a gas supply source outside the process chamber and configured to provide a cooling gas; and a gas filter connected to the gas supply source and configured to guide the cooling gas that is provided by the gas supply source into the process chamber, wherein the gas filter includes one or more wall surfaces at least partially defining a gas flow path for the cooling gas, wherein the gas filter includes a first region including a first material and a second region including a second material, the first region and the second region including different materials, the first region being on the second region, the first region and the second region having a same inclination angle greater than 0 with respect to a horizontal direction, and the first material and the second material having different respective dielectric constants, wherein the first region and the second region are configured to cause the cooling gas flowing through the gas flow path to flow upwardly concurrently with colliding with the one or more wall surfaces at least partially defining the gas flow path.

2. The substrate processing apparatus of claim 1, wherein the gas flow path has a linear shape in a direction extending parallel to a central longitudinal axis of the gas filter.

3. The substrate processing apparatus of claim 1, wherein the gas filter includes a plurality of first regions and a plurality of second regions, the plurality of first regions including the first region, the plurality of second regions including the second region, the plurality of first regions and the plurality of second regions are alternately arranged in the gas filter, and the plurality of first regions and the plurality of second regions have a same thickness and the same inclination angle.

4. The substrate processing apparatus of claim 1, wherein each given region of the first region and the second region has a center portion at a central longitudinal axis of the gas filter that is at a lower vertical level than an edge portion of the given region at an outer edge of the gas filter and is configured to be inclined with respect to the gas flow path.

5. The substrate processing apparatus of claim 1, wherein the first region and the second region have one end portion that is at a lower vertical level than another end portion, and are configured to be inclined with respect to the gas flow path.

6. The substrate processing apparatus of claim 1, wherein the gas filter includes a plurality of first regions and a plurality of second regions, the plurality of first regions including the first region, the plurality of second regions including the second region, the plurality of first regions and the plurality of second regions are alternately arranged, and at least one first region of the plurality of first regions and at least one second region of the plurality of second regions have a plurality of thicknesses and a plurality of inclination angles.

7. The substrate processing apparatus of claim 6, wherein the plurality of thicknesses in the at least one first region are different from each other, respectively, and the plurality of inclination angles in the at least one first region are different from each other, respectively.

8. The substrate processing apparatus of claim 7, wherein the plurality of thicknesses in the at least one second region are different from each other, respectively, and the plurality of inclination angles in the at least one second region are different from each other, respectively.

9. The substrate processing apparatus of claim 1, wherein the gas supply unit further comprises a body within the process chamber.

10. A substrate processing apparatus, comprising:

a process chamber having one or more inner surfaces at least partially defining an internal space;

an upper electrode portion in an upper end portion of the internal space of the process chamber;

a lower electrode portion in the internal space of the process chamber to face the upper electrode portion; and a gas supply unit configured to supply cooling gas to a bottom surface of a substrate seated on the lower electrode portion, wherein the gas supply unit includes a gas filter connected to a gas supply source and configured to guide the cooling gas that is provided by the gas supply source into the process chamber, and wherein the gas filter includes a first region including a first material and a second region including a second material, the first region and the second region including different materials, the first region being on the second region, the first region and the second region having a same inclination angle greater than 0 with respect to a horizontal direction, and the first material and the second material having different respective dielectric constants.

11. The substrate processing apparatus of claim 10, wherein the gas filter includes a plurality of first regions and a plurality of second regions, the plurality of first regions including the first region, the plurality of second regions including the second region, the plurality of first regions and the plurality of second regions are alternately arranged in the gas filter, and the plurality of first regions and the plurality of second regions have a same thickness and the same inclination angle.

12. The substrate processing apparatus of claim 10, wherein the gas filter includes a plurality of first regions and a plurality of second regions, the plurality of first regions including the first region, the plurality of second regions including the second region, the plurality of first regions and the plurality of second regions are alternately arranged, and at least one first region of the plurality of first regions and at least one second region of the plurality of second regions have a plurality of thicknesses and a plurality of inclination angles.

13. A substrate processing apparatus, comprising:

a process chamber having one or more inner surfaces at least partially defining an internal space;

an upper electrode portion in an upper end portion of the internal space of the process chamber;

a lower electrode portion in the internal space of the process chamber to face the upper electrode portion; and a gas supply unit configured to supply cooling gas to a bottom surface of a substrate seated on the lower electrode portion, wherein the gas supply unit includes a gas filter configured to guide the cooling gas into the process chamber, wherein the gas filter includes a plurality of first regions including a first material and a plurality of second regions including a second material, the first material and the second material having different respective dielectric constants, wherein the plurality of first regions and the plurality of second regions are alternately arranged, at least one first region of the plurality of first regions and at least one second region of the plurality of second regions have an inclination angle greater than 0 with respect to a horizontal direction.

14. The substrate processing apparatus of claim 13, wherein the at least one first region of the plurality of first regions and the at least one second region of the plurality of second regions have a same angle with respect to the horizontal direction.

15. The substrate processing apparatus of claim 14, wherein the at least one first region of the plurality of first regions and the at least one second region of the plurality of second regions have a same thickness.

16. The substrate processing apparatus of claim 13, wherein each of the at least one first region of the plurality of first regions and each of the at least one second region of the plurality of second regions has a center portion at a central longitudinal axis of the gas filter that is at a lower vertical level than an edge portion of the given region at an outer edge of the gas filter.

17. The substrate processing apparatus of claim 13, wherein the gas filter includes one or more wall surfaces at least partially defining a gas flow path for the cooling gas.

18. The substrate processing apparatus of claim 13, wherein the at least one first region of the plurality of first regions and the at least one second region of the plurality of second regions have a different thickness.

19. The substrate processing apparatus of claim 13, wherein some of the plurality of first regions have a different thickness from each other.

20. The substrate processing apparatus of claim 13, wherein the gas filter includes a plurality of third regions including a third material different from the first and second materials, the plurality of first regions, the plurality of second regions and the plurality of third regions are sequentially and alternately arranged.

* * * * *